(12) United States Patent
Wu

(10) Patent No.: US 11,973,392 B2
(45) Date of Patent: Apr. 30, 2024

(54) LINEAR ACTUATOR

(71) Applicant: J-STAR MOTOR INDUSTRIAL CO., LTD., Taichung (TW)

(72) Inventor: Wei-Fan Wu, Taichung (TW)

(73) Assignee: J-STAR MOTOR INDUSTRIAL CO., LTD., Taichung (TW)

( * ) Notice: Subject to any disclaimer, the term of this patent is extended or adjusted under 35 U.S.C. 154(b) by 345 days.

(21) Appl. No.: 17/453,488

(22) Filed: Nov. 3, 2021

(65) Prior Publication Data

US 2022/0224214 A1 Jul. 14, 2022

(30) Foreign Application Priority Data

Jan. 11, 2021 (CN) .......................... 202120061849.5

(51) Int. Cl.
*H05K 1/18* (2006.01)
*H02K 41/02* (2006.01)

(52) U.S. Cl.
CPC .............. *H02K 41/02* (2013.01); *H05K 1/181* (2013.01); *H05K 2201/10053* (2013.01); *H05K 2201/10325* (2013.01)

(58) Field of Classification Search
CPC .......... H05K 2201/10053; H05K 2201/10325; H05K 1/181; H02K 11/21; H02K 11/33; H02K 41/02; H02K 7/116
See application file for complete search history.

(56) References Cited

U.S. PATENT DOCUMENTS

2008/0169657 A1\* 7/2008 Horton .................... E05B 83/30
200/557
2018/0266530 A1\* 9/2018 Alfano ............... H01R 13/5202

\* cited by examiner

*Primary Examiner* — Bryan R Perez
(74) *Attorney, Agent, or Firm* — CKC & Partners Co., LLC

(57) ABSTRACT

A linear actuator includes a controlling module, a driving module and a transmission module. The controlling module includes a circuit board, two micro switches and a socket. The two micro switches are electrically connected to the circuit board. A first end of the socket is electrically connected to the circuit board, and a second end of the socket has a plurality of first connecting parts. The driving module is electrically connected to the controlling module and includes a motor and a connecting mount. The connecting mount is electrically connected to the motor and has a plurality of second connecting parts. The second connecting parts are detachably connected to the first connecting parts so as to electrically connect the connecting mount to the socket. The transmission module is connected to the motor and driven by the motor.

6 Claims, 5 Drawing Sheets

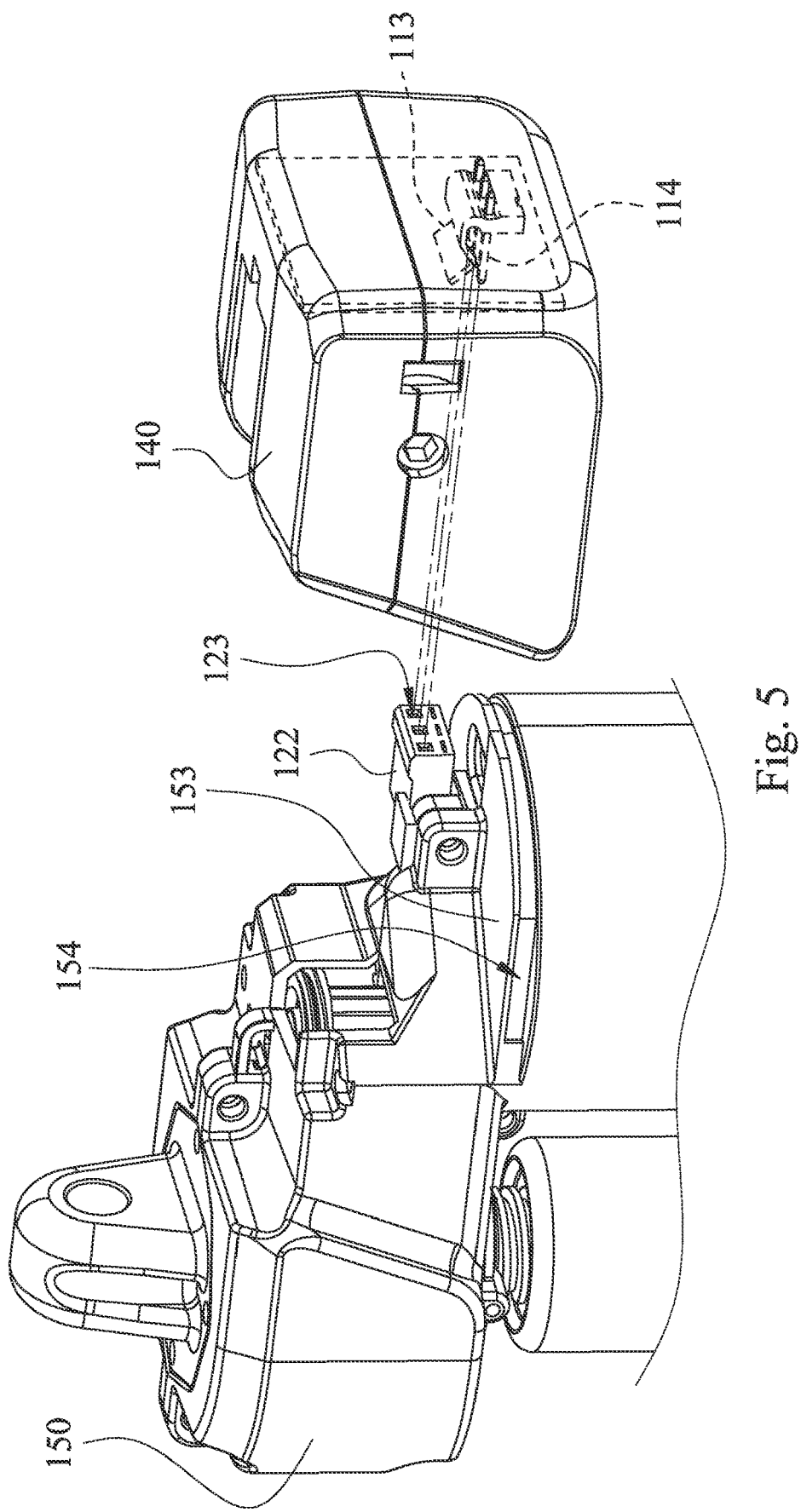

LINEAR ACTUATOR

RELATED APPLICATIONS

This application claims priority to China Application Serial Number 202120061849.5, filed Jan. 11, 2021, which is herein incorporated by reference.

BACKGROUND

Technical Field

The present disclosure relates to a linear actuator. More particularly, the present disclosure relates to a linear actuator with a motor.

Description of Related Art

In general, the electronic components inside the linear actuator are electrically connected to the circuit board through wires. However, with the development of linear actuators, amount of the internal electronic components is increasing, and crossed wires also make the structure of linear actuator more complex, so that the structure of the linear actuator becomes more complicated, and the assembly of the linear actuator also becomes more complicated. Not only is the assembly time increased but also the cost of manufacturing is substantially increased.

Therefore, the development of a linear actuator which can be quickly assembled has become the goal of the relevant industries.

SUMMARY

According to one aspect of the present disclosure, a linear actuator includes a controlling module, a driving module and a transmission module. The controlling module includes a circuit board, two micro switches and a socket. The two micro switches are electrically connected to the circuit board. A first end of the socket is electrically connected to the circuit board, and a second end of the socket has a plurality of first connecting parts. The driving module is electrically connected to the controlling module and includes a motor and a connecting mount. The connecting mount is electrically connected to the motor and has a plurality of second connecting parts. The second connecting parts are detachably connected to the first connecting parts so as to electrically connect the connecting mount to the socket. The transmission module is connected to the motor and driven by the motor.

These and other features, aspects, and advantages of the present disclosure will become better understood with reference to the following description and appended claims.

BRIEF DESCRIPTION OF THE DRAWINGS

The present disclosure can be more fully understood by reading the following detailed description of the embodiment, with reference made to the accompanying drawings as follows:

FIG. 5 shows a partial exploded view of the linear actuator according to the embodiment in FIG. 1.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as being "connected to" another element, it can be directly connected to other elements, or it can be indirectly connected to the other element, that is, intervening elements may be present. In contrast, when an element is referred to as being "directly connected to" another element, there are no intervening elements present. In addition, the terms first, second, third, etc. are used herein to describe various elements or components, and these elements or components should not be limited by these terms. Consequently, a first element or component discussed below could be termed a second element or component.

Figure 1:
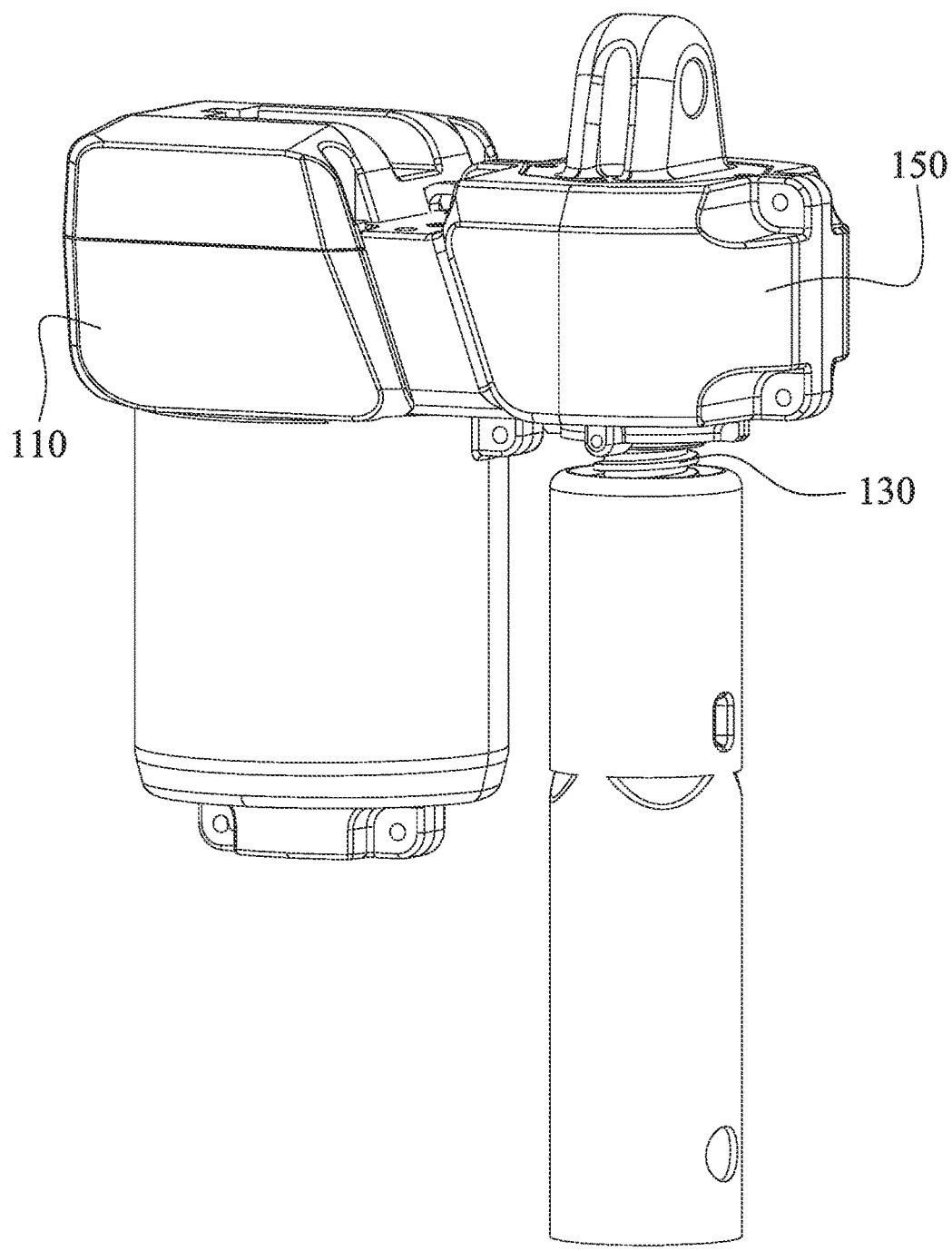
FIG. 1 is a three-dimensional schematic view of a linear actuator according to one embodiment of the present disclosure.
Figure 2:
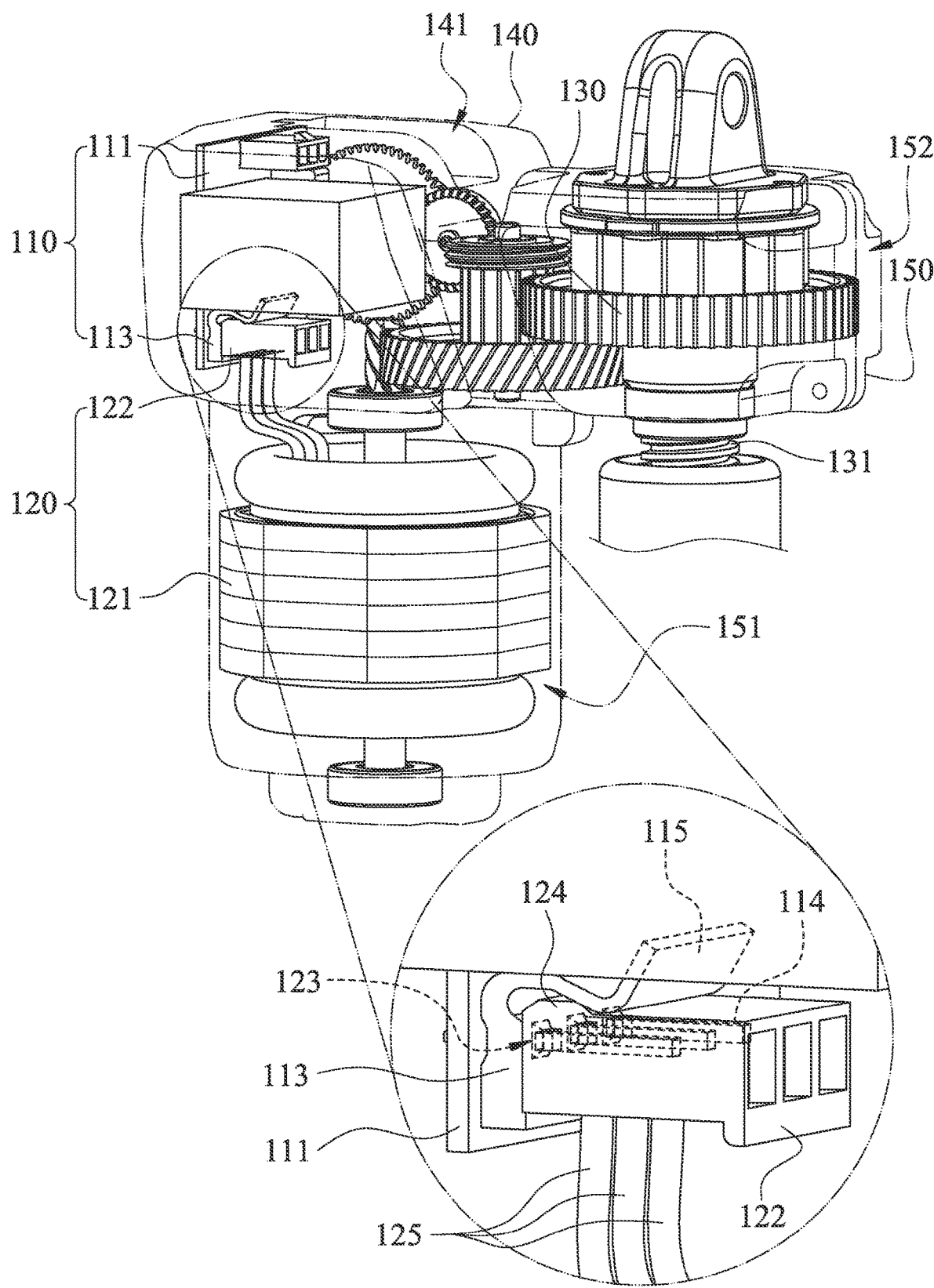
FIG. 2 shows a three-dimensional schematic view of a part of the linear actuator according to the embodiment in FIG. 1.
Figure 3:
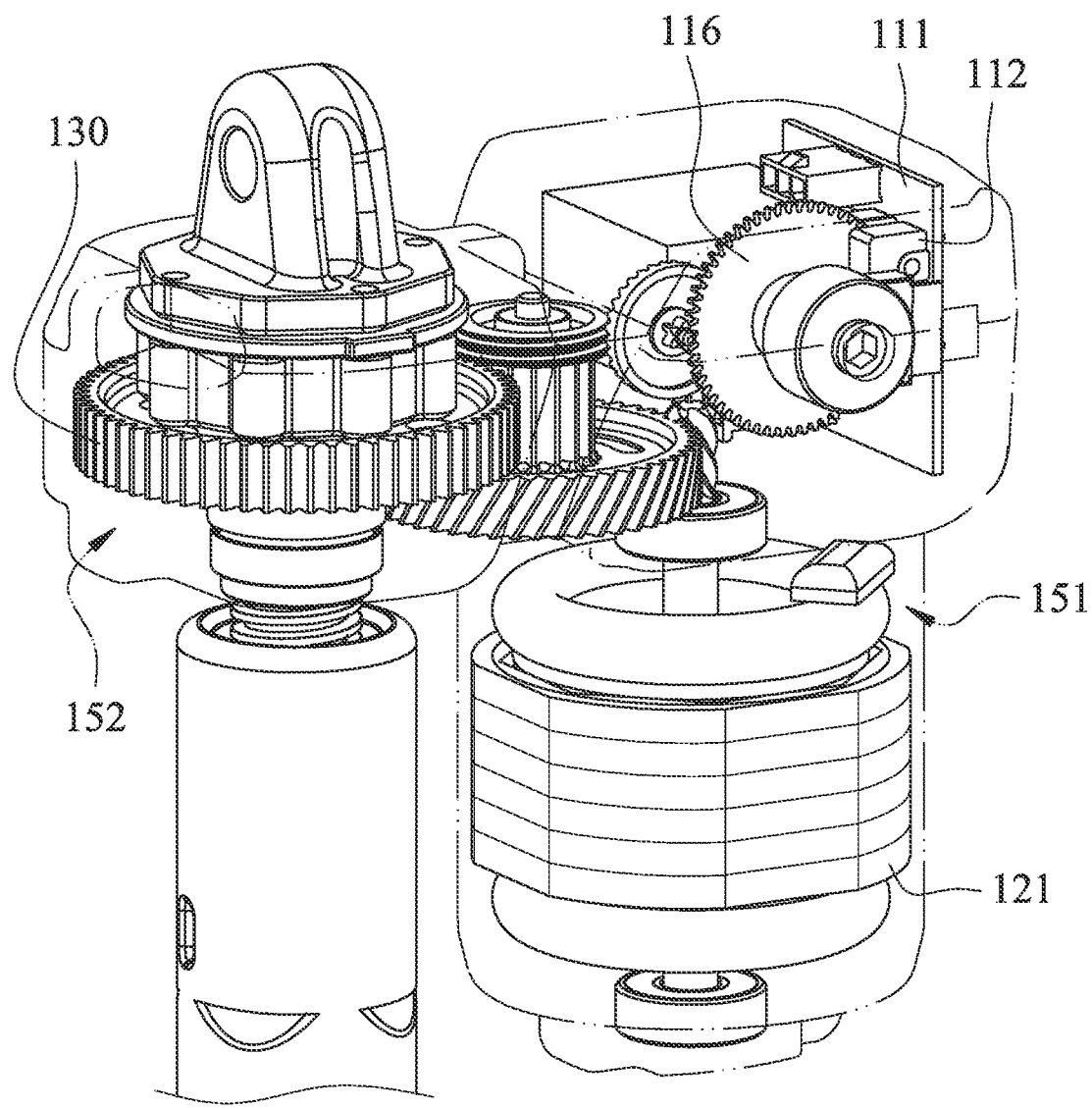
FIG. 3 shows a three-dimensional schematic view of another part of the linear actuator according to the embodiment in FIG. 1.
Figure 4:
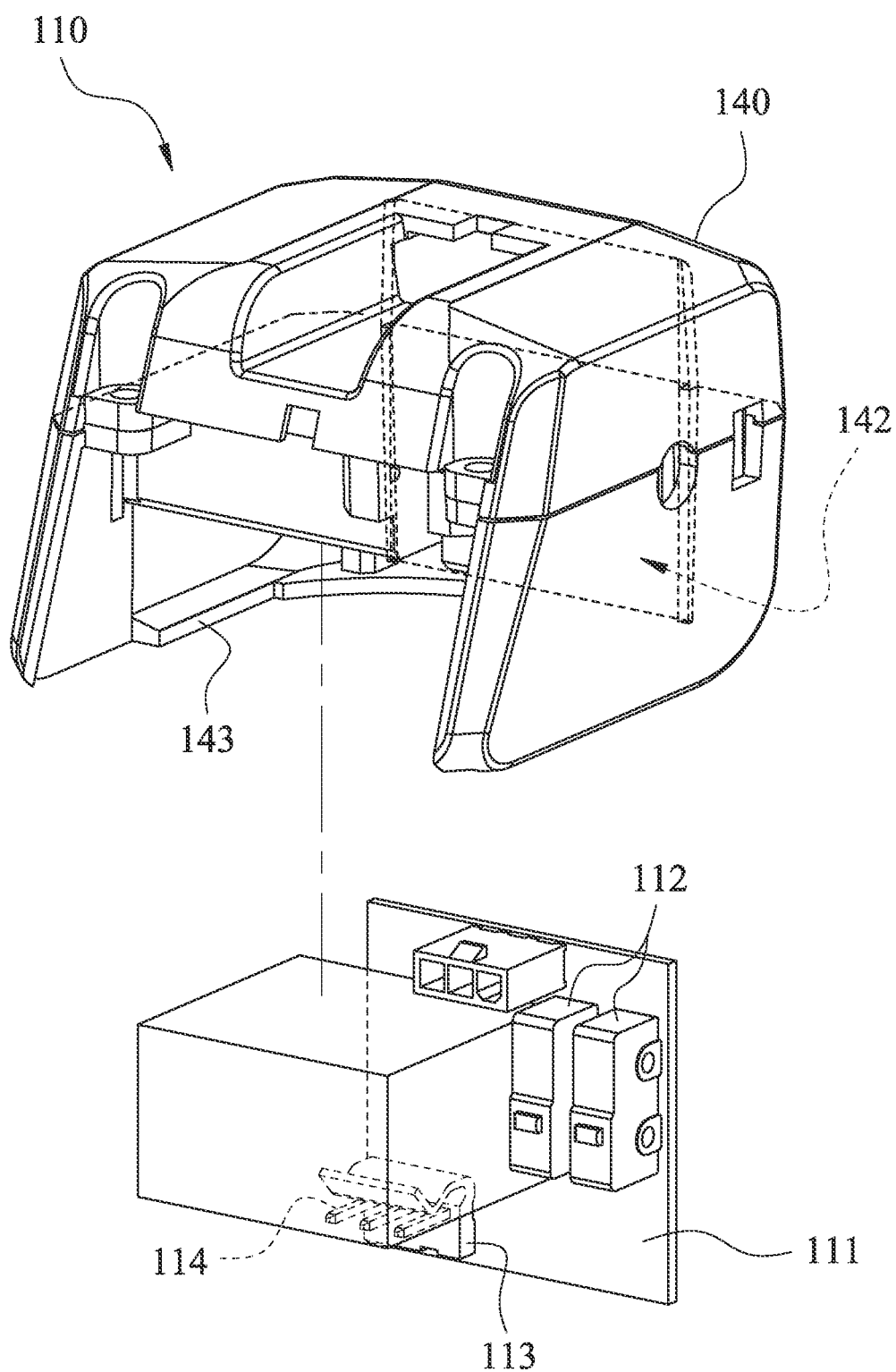
FIG. 4 shows a partial exploded view of the controlling module according to the embodiment in FIG. 1.

Please refer to FIGS. 1, 2, 3 and 4. FIG. 1 is a three-dimensional schematic view of a linear actuator 100 according to one embodiment of the present disclosure. FIG. 2 shows a three-dimensional schematic view of a part of the linear actuator 100 according to the embodiment in FIG. 1. FIG. 3 shows a three-dimensional schematic view of another part of the linear actuator 100 according to the embodiment in FIG. 1. FIG. 4 shows a partial exploded view of the controlling module 110 according to the embodiment in FIG. 1. The linear actuator 100 includes a controlling module 110, a driving module 120 and a transmission module 130. The driving module 120 is electrically connected to the controlling module 110, and the transmission module 130 is connected to and driven by the driving module 120.

In detail, the controlling module 110 includes a circuit board 111, two micro switches 112 and a socket 113. The micro switches 112 are electrically connected to the circuit board 111. The micro switches 112 are triggered by a distance transmission gear 116, and the distance transmission gear 116 is connected to the transmission module 130. A first end of the socket 113 is electrically connected to the circuit board 111, and a second end of the socket 113 has a plurality of first connecting parts 114.

The driving module 120 includes a motor 121 and a connecting mount 122. The connecting mount 122 is electrically connected to the motor 121. The connecting mount 122 has a plurality of second connecting parts 123. The second connecting parts 123 are detachably connected to the first connecting parts 114 of the socket 113 so as to electrically connect the connecting mount 122 to the socket 113. The driving module 120 can further include at least one wire 125. In the embodiment of FIG. 1, the number of the wires 125 is three. One of two ends of each wire 125 is electrically connected to the first end of the connecting mount 122, and the other one of the two ends of each wire 125 is electrically connected to the motor 121. The transmission module 130 is connected to the motor 121 and includes a threaded rod 131, and the transmission module 130 is driven by the motor 121.

Specifically, when the motor 121 rotates, the distance transmission gear 116 is linked to trigger the micro switches 112, and the rotation status of the motor 121 can be obtained to be converted into the distance of the threaded rod 131. When the threaded rod 131 reaches the preset position, the motor 121 can be controlled to stop. The micro switches 112, the distance transmission gear 116 and the motor 121 are conventional and are not the key factors of present disclosure, and the details thereof will not be mentioned.

The conventional micro switch is not disposed on the circuit board, and there are no sockets and connecting mounts. Instead, the conventional micro switch is connected by many wires for electrical connecting. With the above structural configuration, the motor 121 can be electrically connected to the circuit board 111 through the socket 113 and the connecting mount 122. Components such as the motor 121 and the micro switches 112 can be electrically connected to a controller (not shown) through another socket (not shown) on the circuit board 111. Therefore, the amount of wires can be reduced, and the assembly of the linear actuator 100 can be more convenient and faster, and also the reliability thereof can be increased.

Specifically, the micro switches 112 and the socket 113 can be electrically connected to the circuit board 111, so as to make the controlling module 110 be assembled into a semi-finished product first, and then the first connecting parts 114 of the socket 113 are aligned with the second connecting parts 123 of the connecting mount 122 to complete the assembly. Therefore, it not only reduces the complexity of the internal structure of the linear actuator 100, but also facilitates modular assembly, and the linear actuator 100 can be more suitable for automatic production.

In the embodiment of FIG. 1, each of the first connecting parts 114 can have a pin structure, and each of the second connecting parts 123 can have a slot structure. Therefore, the number of the wire and the manual soldering process can be reduced. In the other embodiment, each of the first connecting parts can have a slot structure, and each of the second connecting parts can have a pin structure. The relative positions of the slot structure and the pin structure can be configured according to the needs of use, and the present disclosure will not be limited thereto.

As shown in FIG. 2, the socket 113 can include a fixing unit 115 for detachably abutting against the connecting mount 122. The connecting mount 122 can include a fixing part 124 protruding from a body of the connecting mount 122, and the fixing unit 115 of the socket 113 detachably abuts against the fixing part 124. Therefore, the strength of the connection between the socket 113 and the connecting mount 122 can be increased, and the socket 113 and the connecting mount 122 are less likely to separate due to the operation of the linear actuator 100.

As shown in FIG. 4, the controlling module 110 can further include a case 140. The case 140 has an accommodating space 141, and the circuit board 111 is disposed in the accommodating space 141. The case 140 can further include an accommodating groove 142, and the circuit board 111 is fixed in the accommodating groove 142. In FIG. 4, the circuit board 111 can be inserted in the accommodating groove 142, and thus the accommodating groove 142 can limit the position of the circuit board 111. When the motor 121 operates, the circuit board 111 would not be affected by shaking, and the circuit board 111 can be electrically connected to the micro switches 112 and the socket 113 stably. Therefore, the stability of the overall structure of the linear actuator 100 can be effectively increased.

The linear actuator 100 can further include a housing 150. The housing 150 is detachably connected to the case 140 and has a first inner space 151 and a second inner space 152. The motor 121 is disposed in the first inner space 151, the transmission module 130 is disposed in the second inner space 152, and the connecting mount 122 is disposed on an outer surface 153 of the housing 150 (shown in FIG. 5).

Please refer to FIGS. 4 and 5. FIG. 5 shows a partial exploded view of the linear actuator 100 according to the embodiment in FIG. 1. As shown in FIGS. 4 and 5, the housing 150 can further include an inserting groove 154, and the case 140 can further include an inserting flange 143. The inserting groove 154 is used for inserting the inserting flange 143. When the inserting flange 143 of the case 140 is abutted against the housing 150 and slidably inserted into the inserting groove 154, the position of the connecting mount 122 can be aligned with the position of the socket 113. With the structural configuration of the sliding insertion of the case 140 and the housing 150, the manual calibration can be omitted, so that the connecting mount 122 and the socket 113 can be positioned more quickly. Further, the stability of the connection between the connecting mount 122 and the socket 113 can also be increased.

In summary, the linear actuator of the present disclosure has the following advantages. First, the internal structure of the linear actuator can be simplified by the arrangement of the socket and the connecting mount, and it facilitates modular assembly, so that the assembly of the linear actuator can be more convenient and faster. Second, the wires can be reduced by the arrangement of the pin structure and the slot structure, and the manual soldering process can be reduced. Third, with the structural configuration of the case and the housing, the positioning effect of the socket and the connecting mount can be increased, and the assembly of the linear actuator can be more convenient.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A linear actuator, comprising:
   a controlling module comprising:
      a circuit board;
      two micro switches electrically connected to the circuit board;
      a socket, wherein a first end of the socket is electrically connected to the circuit board, and a second end of the socket has a plurality of first connecting parts; and
      a case having an accommodating space and comprising an inserting flange, wherein the circuit board is disposed in the accommodating space, the socket is disposed in the case, and the inserting flange is integrally formed around an inner wall of the case;
   a driving module electrically connected to the controlling module, and comprising:
      a motor; and a connecting mount electrically connected to the motor and having a plurality of second connecting parts, wherein the second connecting parts are detachably connected to the first connecting parts so as to electrically connect the connecting mount to the socket;

a transmission module connected to the motor and driven by the motor; and a housing detachably connected to the case and having a first inner space and a second inner space, wherein the motor is disposed in the first inner space, the transmission module is disposed in the second inner space, the connecting mount is disposed on an outer surface of the housing, the housing comprises an inserting groove, the inserting groove is disposed at the outer surface, and the inserting groove is used for inserting the inserting flange to align the connecting mount with the socket.

2. The linear actuator of claim 1, wherein the socket comprises a fixing unit for detachably abutting against the connecting mount.

3. The linear actuator of claim 2, wherein the connecting mount comprises a fixing part protruding from a body of the connecting mount, and the fixing unit of the socket detachably abuts against the fixing part.

4. The linear actuator of claim 1, wherein each of the first connecting parts has a pin structure, and each of the second connecting parts has a slot structure.

5. The linear actuator of claim 1, wherein the driving module further comprises at least one wire, one of two ends of the at least one wire is electrically connected to the first end of the connecting mount, and the other one of the two ends of the at least one wire is electrically connected to the motor.

6. The linear actuator of claim 1, wherein the case further comprises an accommodating groove, and the circuit board is fixed in the accommodating groove.

* * * * *